United States Patent [19]

Taylor

[11] 4,009,374

[45] Feb. 22, 1977

[54] PSEUDO-RANDOM BIDIRECTIONAL COUNTER

[75] Inventor: H. Scott Taylor, Newport Beach, Calif.

[73] Assignee: Rockwell International Corporation, El Segundo, Calif.

[22] Filed: May 17, 1976

[21] Appl. No.: 687,416

[52] U.S. Cl. .................. 235/92 SH; 235/92 DE; 235/92 R; 331/78

[51] Int. Cl.² .............. H03K 23/30; H03B 29/00

[58] Field of Search ...... 235/92 SH, 92 DE, 92 EV, 235/92 NG, 92 MB, 92 GT, 152; 331/78; 328/37

[56] References Cited

UNITED STATES PATENTS

| | | | |
|---|---|---|---|
| 3,691,472 | 9/1972 | Bohman | 331/78 |
| 3,742,381 | 6/1973 | Hurd | 331/78 |
| 3,885,139 | 5/1975 | Hurd | 331/78 |

Primary Examiner—Joseph M. Thesz
Attorney, Agent, or Firm—Howard R. Greenberg; Robert J. Crawford

[57] ABSTRACT

A pseudo-random counter, comprising any conventional shift register having a plurality of flip-flop stages, affords counting capability in two directions, either left or right, by providing logic circuit means for generating from the flip-flop outputs a first repetitive logic bit stream which is shifted to the right in response to one gating signal and a second repetitive logic bit stream which is shifted to the left in response to another gating signal, with the two bit streams being mirror images of each other and applied to the register such that the binary output of the register after advancing the count by any number of clock pulses in the presence of one of the gating signals is the same as the binary output which would have been obtained by regressing the count by the same number of clock pulses in the presence of the other gating signal.

9 Claims, 5 Drawing Figures

TABLE FOR LOGIC CIRCUIT MEANS 24

| NO. OF STAGES | EXCLUSIVE OR Q |
|---|---|
| 3 | A ⊕ C |
| 4 | A ⊕ D |
| 5 | A ⊕ D |

| TABLE FOR LOGIC CIRCUIT MEANS 14 | |
| --- | --- |
| NO. OF STAGES | EXCLUSIVE OR Q |
| 3 | B⊕C |
| 4 | C⊕D |
| 5 | C⊕E |
| 6 | E⊕F |
| 7 | F⊕G |
| 8 | D⊕E⊕F⊕H |
| 9 | E⊕I |
| 10 | G⊕J |
| 11 | I⊕K |
| 12 | F⊕H⊕K⊕L |

PSEUDO-RANDOM BIDIRECTIONAL COUNTER

BACKGROUND OF THE INVENTION

The subject invention pertains generally to electronic digital binary counters and in particular to a class of counters commonly referred to as pseudo-random.

As is well known to those familiar with electronic counters, pseudo-random counters which comprise a plurality of flip-flop stages arranged to function as a shift register afford major advantages for integrated circuit designs which greatly outweigh the pseudo-random sequential binary output obtained from any sequential counting segment. Specifically, the absence of the plethora of gates and associated leads required for interconnecting the various stages of other types of conventional counters, particularly when there are numerous stages, affords a neat and compact topological integrated circuit layout which greatly enhances miniaturization and consequently design attractiveness. Unfortunately, the attractiveness of pseudo-random counters for integrated circuit design is somewhat undermined by their inability to count in more than one direction, thus limiting versatility by precluding use as an up/down counter.

With the foregoing in mind, it is a primary object of the present invention to provide a new and improved pseudo-random counter.

It is a further object of the present invention to provide such a pseudo-random counter which is bidirectional, viz. capable of counting in two directions, either to the left or to the right.

It is still a further object of the present invention to provide such counting bidirectionality through the use of two bit streams which are so related that the same binary output is obtained when counting forward in one direction as would have been obtained by counting backward in the opposite direction.

The foregoing objects as well as others, and the means by which they are achieved through the present invention may best be appreciated by referring to the Detailed Description of the Preferred Embodiment which follows hereinafter together with the appended drawings.

BRIEF DESCRIPTION OF THE INVENTION

In accordance with the stated objects, the pseudo-random bidirectional counter of the invention comprises a plurality of flip-flops for sequential interconnection to function as a shift register with the output logic level signal of each flip-flop being transferred to the input of an adjacent flip-flop in response to each clock pulse supplied from a clock source. Switching circuit means are provided for connecting the output of each flip-flop to either the input of the next succeeding flip-flop in response to a right count gating signal to afford a right count or to the input of the next preceding flip-flop in response to a left count gating signal to afford a left count. First logic circuit means, comprising exclusive OR circuitry, are provided for generating a first repetitive logic bit stream from the outputs of the flip-flops which is sequentially applied to the input of the first flip-flop of the register in synchronism with the clock pulses in the presence of the right count gating signal. Second logic circuit means, also comprising exclusive OR circuitry, are provided for generating a second repetitive logic bit stream from the outputs of the flip-flops which is sequentially applied to the input of the last flip-flop of the register in synchronism with the clock pulses in the presence of the left count gating signal, with the two bit streams being mirror images of each other and applied to the register such that the binary output of the register after advancing the count by any number of clock pulses in the presence of one of the gating signals is the same as the binary output which would have been obtained by regressing the count (counting backward) by the same number of clock pulses in the presence of the other gating signal. Consequently, when the count is in one direction in the presence of the associated gating signal, the binary output sequence obtained is an exact reconstruction of the other direction binary output sequence in reverse thus realizing an efficacious bidirectional counter.

BRIEF DESCRIPTION OF THE DRAWINGS

FIG. 3($b$) depicts the two bit streams required to obtain the requisite counting sequences for the four-stage counter.

DETAILED DESCRIPTION OF THE PREFERRED EMBODIMENT

Figure 1:
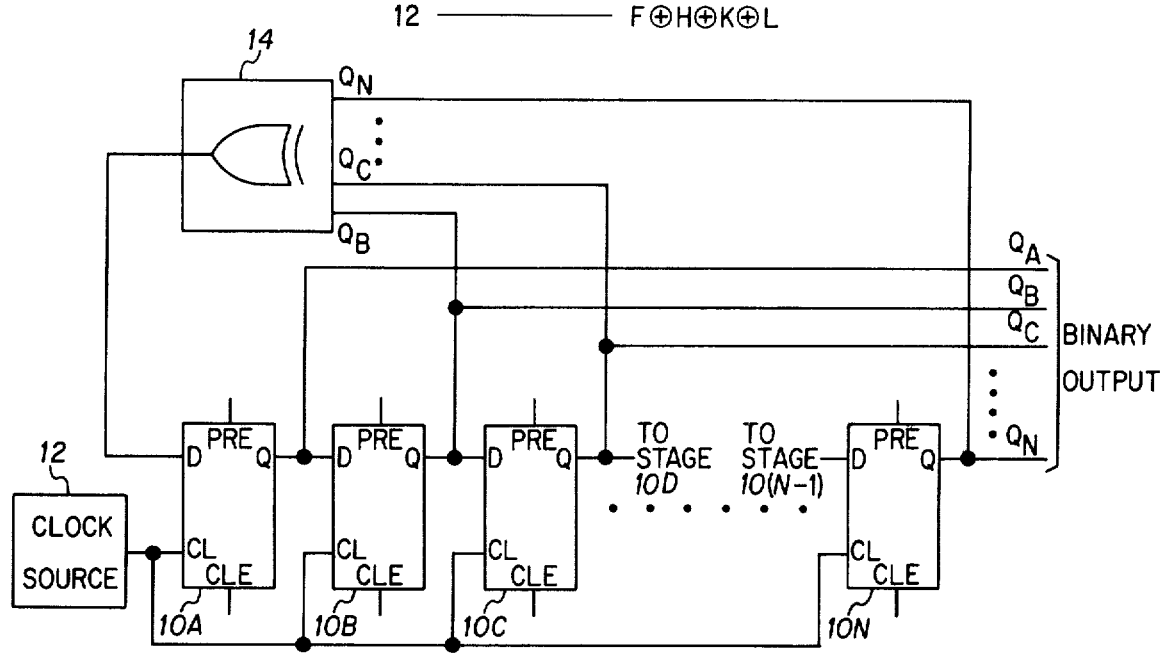
FIG. 1 is a logic diagram of a typical pseudo-random counter found in the prior art for counting in a single direction to the right.

As shown in FIG. 1, a typical pseudo-random counter, such as described beginning at the bottom of page 298 of the textbook "Designing with TTL Integrated Circuits," comprises a plurality of flip-flops of any desired type, such as D flip-flops 10A–10N (N representing any number of desired stages), arranged to function as a shift register, with the Q output of each flip-flop stage of the register being connected to the D input of the next succeeding flip-flop. In response to each clock pulse supplied from a clock source 12, the output logic level signal, either 1 or 0, at the Q output of each flip-flop 10 is transferred to the D input of the next succeeding flip-flop to appear at its output so as to provide a right count (logic bits shifted to the right). The Q outputs of all the flip-flops 10, with the exception of the first one 10A, are applied as inputs to a logic circuit means 14, which comprises exclusive OR circuitry, whose output is connected to the D input of the first flip-flop 10A. The logic circuit means 14 is designed to generate a predetermined logic bit stream which repeats itself after a predetermined number of clock pulses as determined by the number of counting stages to provide a binary output from the flip-flop 10 Q outputs which has a logical order which appears random (thus the term pseudo-random) during a sequential counting segment. Until the cycle is repeated, each clock pulse results in a unique binary output which can be used to define the various counts of the repetitive bit stream. The preset and clear inputs, PRE and CLE, respectively of flip-flops 10, may be used to initiate the bit pattern at any desired binary output.

To accomplish the foregoing, various ones of the Q outputs of flip-flops 10 are exclusively OR'ed together to provide the predetermined bit stream as a function of the number of counting stages in the shift register. This is illustrated by the table of FIG. 1 that relates which outputs to exclusively OR together for different number of stages between 3 and 12. For example, with a pseudo-random counter comprising four flip-flop stages 10A–10D, the Q outputs of flip-flops C and D would be exclusively OR'ed together to generate the desired bit pattern. As a further example, for a counter comprising 8 flip-flop stages 10A–10H, the Q outputs of flip-flops 10D and 10E would first be exclusively OR'ed together, the output of which would then be exclusively OR'ed with flip-flop 10F whose output in turn would be exclusively OR'ed with flip-flop 10H. At this point, it should be mentioned that the pseudo-random counter depicted is of the maxi-length type which maximizes the count obtainable before repetitive binary outputs recurs as a result of the bit stream. Although the invention will be disclosed hereinafter as embodied in a maxi-length counter, it is to be realized that it need not be limited thereto since any other pseudo-random count will do. In the case of a four-stage pseudo-random maxi-length counter, the predetermined bit stream is repeated after every 15 clock pulses. The number of clock pulses required to repeat a bit stream for any pseudo-random maxi-length counter containing N stages is $2^N-1$.

Figure 2:
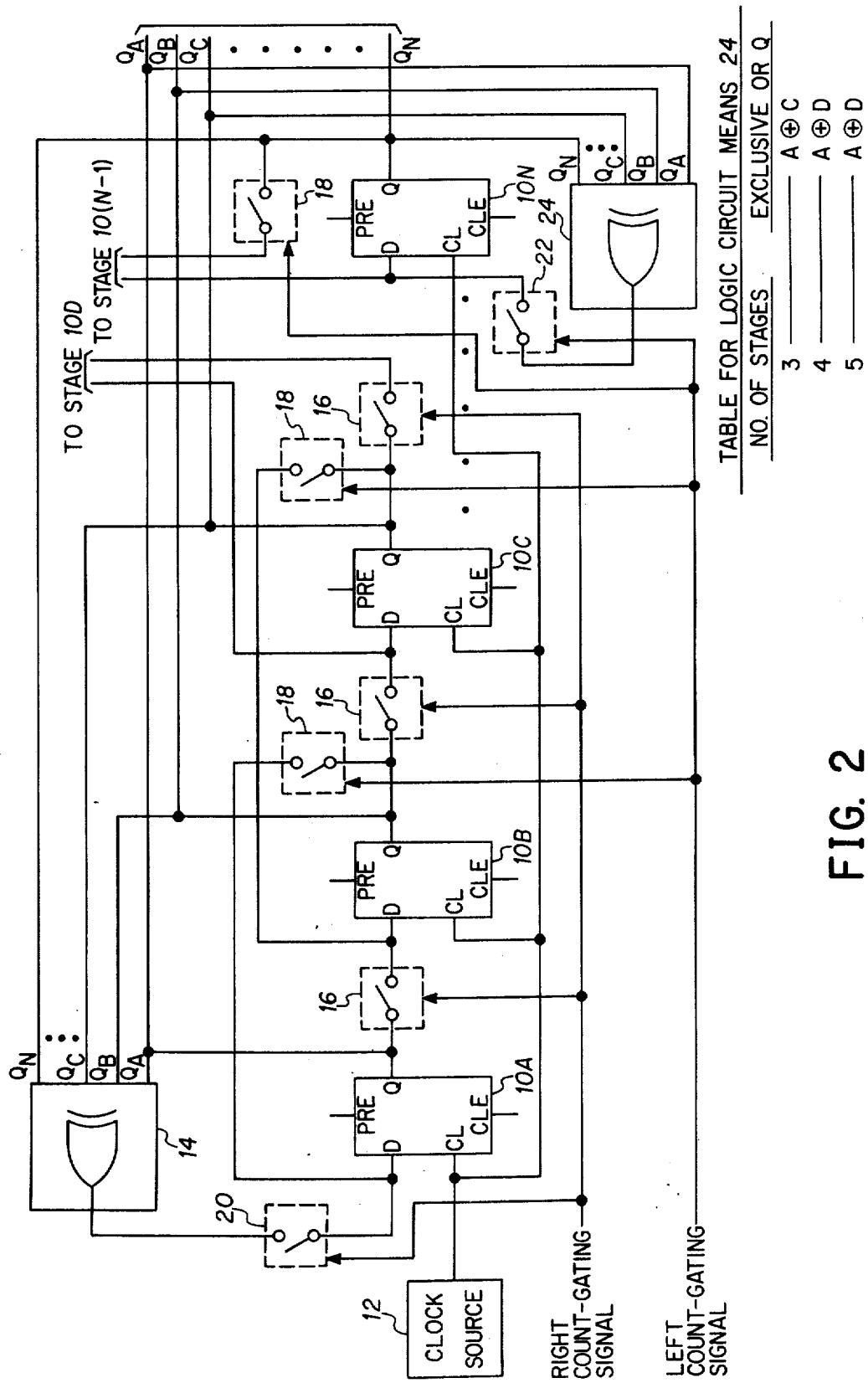
FIG. 2 is a logic diagram of the pseudo-random bidirectional counter of the invention for counting either to the left or to the right.

Looking now to FIG. 2, a modified pseudo-random counter (elements common to both FIGS. 1 and 2 bearing the same numerical designations) is shown which is capable of counting in two directions, either left or right. To accomplish this, switching means shown as symbolic switches are provided for connecting the Q output of each flip-flop 10 to the D input of the next succeeding flip-flop 10 in response to a right count gating signal to shift the logic bits to the right and to the D input of the next preceding flip-flop 10 in response to a count left gating signal to shift the logic bits to the left. Thus, symbolic switches 16 are closed in response to the right count gating signal to permit the bit stream to pass to the right while symbolic switches 18 are closed in response to the left count gating signal to permit the bit stream to be passed to the left.

The Q outputs of flip-flops 10 are connected as inputs to the logic circuit means 14 as before to provide the same logic bit stream at its output that is applied to the D input of the first flip-flop 10A via symbolic switch 20 which is closed in response to the right count gating signal to pass the bits to the right as described earlier. When it is desired to have the pseudo-random counter count in the opposite direction to the left, the left counting gating signal closes a symbolic switch 22 so as to apply to the D input of the last flip-flop 10N the output of a logic circuit means 24, comprising exclusive OR circuitry, whose inputs like that of logic circuit means 14 are derived from the Q outputs of the flip-flops 10. Logic circuit means 24 combines the flip-flop 10 Q outputs so as to generate a second repetitive logic bit stream which is the mirror image of the first bit stream, viz. for any counting segment the value of the first bit is the same as the value which would have occurred for the last bit of the counterpart first bit stream, the second bit for the second bit stream is the same as the next to last bit value for the first bit stream, etc. Thus, the binary output of the register after advancing the count by any number of clock pulses in the presence of one of the gating signals is the same as the binary output which would have been obtained by regressing the count (counting backward therefrom) the same number of clock pulses in the presence of the other gating signal. Consequently, the binary output sequence obtained as the logic bits are shifted in one direction during a counting segment in the presence of the associated gating signal is an exact reconstruction of the binary output sequence obtained were the counter to count backward in the presence of the other gating signal to achieve counting bidirectionality. It is recognized that the counter cannot physically count backwards for a gating signal (although advancing the count in the presence of the other gating signal is the equivalent) and that the described comparison is a hypothetical one to facilitate explaining the invention.

Figure 3A:
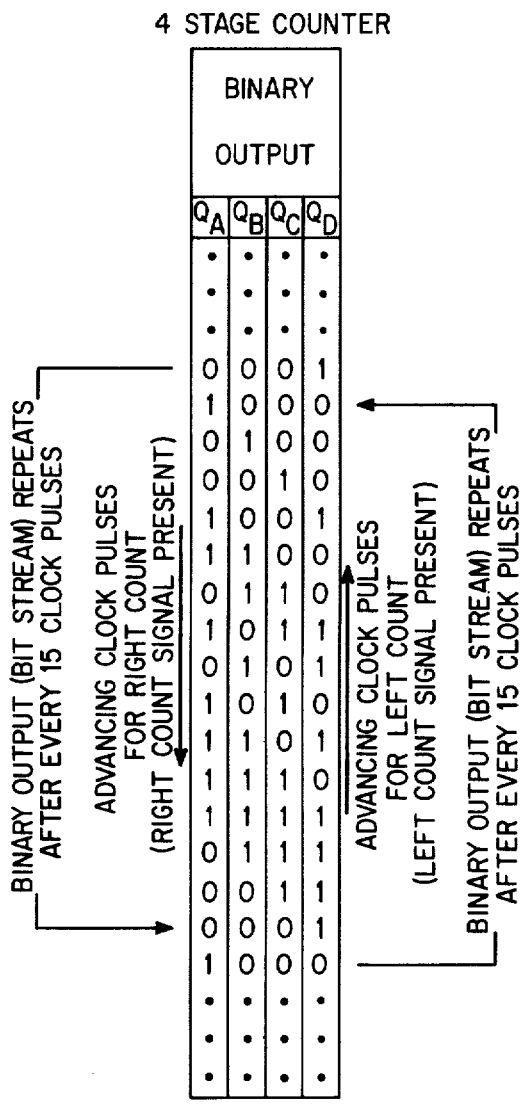
FIG. 3($a$) depicts the pseudo-random binary output counting sequence obtained for a four-stage counter to illustrate the bi-directionality of the counter.
Figure 3B:
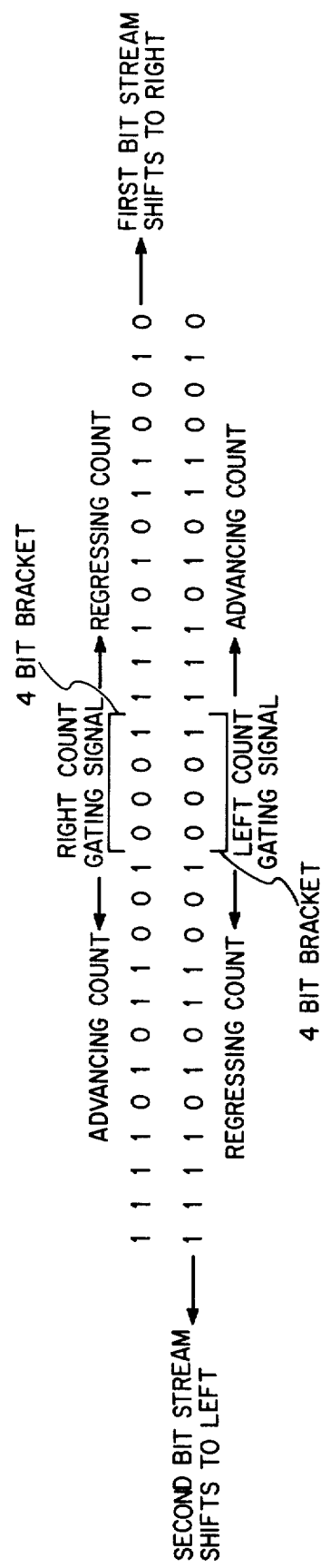

The foregoing is illustrated for a four-stage counter by the chart of FIG. 3(a) which shows the register random binary output sequence obtained by advancing clock pulses for a right count in the presence of the right count gating signal or a left count in the presence of the left count gating signal. It is to be first noted that the binary output which results from the bit stream pattern predetermined by logic circuit means 14 or 24 repeats itself after every 15 clock pulses ($2^4-1$). It is next to be noted that during an advancing count in whichever direction the counter is proceeding as a result of the gating signal applied thereto, the binary output of the register after any given number of clock pulses is the same as that which would have been obtained by regressing the count by the same number of clock pulses in the presence of the other gating signal to count backward in the opposite direction. This is further amplified by the two logic bit streams depicted in FIG. 3(b) which give rise to the binary output counting sequences of FIG. 3(a) and in which the four bit bracket (which identifies the four-stage register binary output at any point in time) shifts one bit to the left or right as denoted for each clock pulse. An advancing count for one direction during the presence of the associated gating signal is thus seen to be the same as a regressing count in the opposite direction in the presence of the latter's associated gating signal. Consequently, the pseudo-random counter of the invention is capable of counting in either of two directions. Although the table of FIG. 2 depicts the inputs to logic circuit means 24 which must be exclusively OR'ed to generate the proper logic bit stream only for a counter containing 3–5 stages, it will be readily obvious to those skilled in the art that the exclusive OR arrangement for any stage counter can be developed using well known logic techniques such as Veitch diagrams. It is also worthy of note that just as in the case for a right count as depicted by the table of FIG. 1, one of the exclusive OR inputs to the logic circuit means 24 for left counting is always the last stage flip-flop Q output before the information is shifted out of the register (flip-flop A for left count as depicted by the table of FIG. 2).

Figure 4:
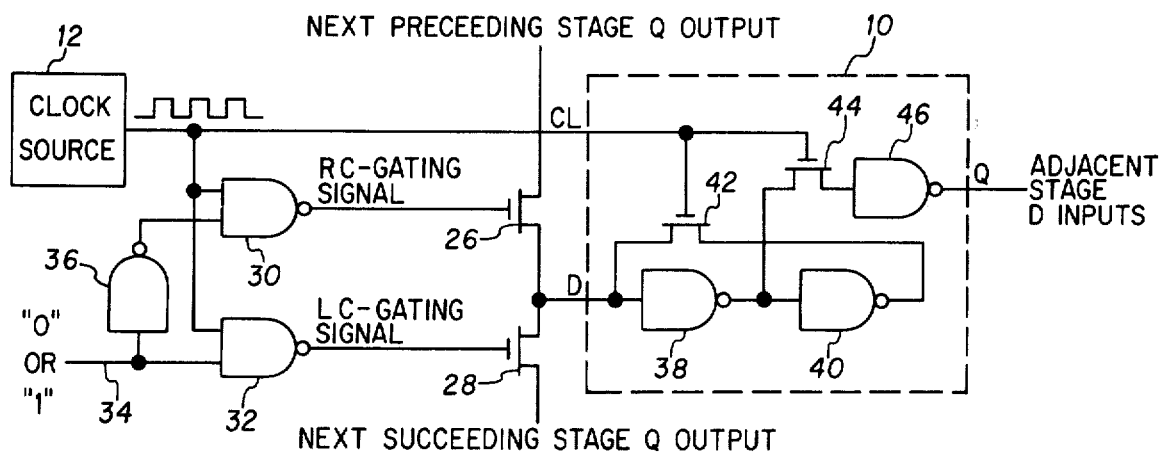
FIG. 4 shows a simple integrated circuit implementation for the switching circuit means and generation of gating signals to control the counting direction and flow of logic bits.

A simple integrated circuit implementation for the switches 16 and 18 and the generation of the right and left count gating signals is shown in FIG. 4. Field effect transistors 26 and 28 connect the D input of an associated flip-flop 10 to the next preceding and next succeeding stage Q outputs, respectively. The gates of transistors 26 and 28 are connected, respectively, to the outputs of NAND gates 30 and 32, each having an input connected to receive the clock pulse output of clock source 12 and a second input connected to receive a logic control signal on a control lead 34, the NAND gate 32 input being connected directly thereto and the NAND gate 30 input being connected via an inverter 36. Assuming that clock source 12 produces positive clock pulses, a logic level 0 on lead 34, after passage through inverter 36 combines with each positive clock pulse to produce a low level signal at the output of NAND gate 30 to provide the right count gating signal for enabling transistor 26 to interconnect the D input of its associated flip-flop 10, to the next preceding stage Q output (right count). Similarly, a logic level 1 on control lead 34 combines with each positive clock pulse output of clock source 12 to produce a low level signal at the output of NAND gate 32 to provide the left count gating signal for enabling transistor 28 to connect the D input of the associated flip-flop 10 to the next succeeding stage Q output (left count). Thus, during the period of each positive clock pulse, the logic level signal applied to the D input of the associated flip-flop 10 is sampled via the enabled transistor 26 or 28 and propagated through inverters 38 and 40 of flip-flop 10 so that it appears at the output of the latter. During this time, the high level logic signal applied to the gates of two other field effect transistors 42 and 44 disables them so that the outputs of inverters 38 and 40 have no effect. At the termination of each positive clock pulse, the enabled transistor 26 or 28 is disabled while transistor 42 is enabled to permit the output of inverter 40 to be fed back to the input of inverter 38 thus effectuating a latching operation. At this time, transistor 44 is also enabled to permit the output of inverter 38 to be applied as an input to an inverter 46 whose output constitutes the Q output of flip-flop 10. Thus, the logic level signal applied to the D input of flip-flop 10 whether from the next preceding or next succeeding stage Q output is transferred to its Q output in response to each clock pulse, the signal being sampled during the positive clock pulse and stored and made available at its flip-flop Q output subsequent thereto.

As the foregoing clearly demonstrates, the pseudo-random bi-directional counter of the invention permits counting to take place in either of two directions, left or right, thus greatly enhancing versatility of pseudo-random counters and thus their suitability for integrated circuit applications. Since modifications to the preferred embodiment herein may occur to those skilled in the art which may very well fall within the scope and spirit of the invention, the foregoing Detailed Description is intended to be merely exemplary and not circumscriptive of the invention as it will now be claimed hereinbelow.

What is claimed is:

1. A pseudo-random bi-directional counter, comprising:
   a source of clock pulses;
   a plurality of flip-flops for sequential interconnection to function as a shift register, the output signal of each flip-flop being transferred to the input of an adjacent flip-flop in response to each clock pulse;
   switching circuit means for connecting the output of each flip-flop to the input of the next succeeding flip-flop in response to a right count gating signal or to the input of the next preceding flip-flop in response to a left count gating signal;
   first logic circuit means for generating a first repetitive logic bit stream from the outputs of said flip-flops which is sequentially applied to the input of the first flip-flop of said register in synchronism with said clock pulses in the presence of said right count gating signal, and
   second logic circuit means for generating a second repetitive logic bit stream from the outputs of said flip-flops which is sequentially applied to the input of the last flip-flop of said register in synchronism with said clock pulses in the presence of said left count gating signal, said bit streams being mirror images of each other and applied to the register such that the binary output of said register after advancing the count by any number of clock pulses in the presence of one of said gating signals is the same as the binary output which would have been obtained by regressing the count by the same number of clock pulses in the presence of the other one of said gating signals.

2. The counter of claim 1 wherein each of said first and second logic circuit means comprises exclusive OR circuitry for combining the outputs of said flip-flops to achieve said respective bit streams, the exclusive OR'-ing arrangement being dependent on the number of said register flip-flops.

3. The counter of claim 2 wherein the number of flip-flops is three and the outputs of the last and middle flip-flops are exclusively OR'ed together in said first logic circuit means and the outputs of the first and last flip-flops are exclusively OR'ed together in said second logic circuit means.

4. The counter of claim 2 wherein the number of flip-flops is four and the outputs of the last and next to last flip-flops are exclusively OR'ed together in said first logic circuit means and the outputs of said first and last flip-flops are exclusively OR'ed together in said second logic circuit means.

5. The counter of claim 2 wherein the number of flip-flops is five and the outputs of the last and middle flip-flops are exclusively OR'ed together in said first logic circuit means and the first and next to last flip-flops are exclusively OR'ed together in said second logic circuit means.

6. The counter of claim 2 wherein one of the inputs to either of said first or second logic circuit means is the output of the last flip-flop stage before the information is shifted out of the register.

7. A method for generating a pseudo-random bidirectional count in a shift register having a plurality of flip-flop stages, comprising:
   generating a series of clock pulses;
   generating from the outputs of the shift register a first repetitive logic bit stream in response to a first gating signal;
   generating from the outputs of the shift register a second repetitive logic bit stream which is the mirror image of said first bit stream in response to a second gating signal;
   shifting said first bit stream to the right in the shift register in synchronism with said clock pulses in response to said first gating signal, and
   shifting said second bit stream to the left in the shift register in synchronism with said clock pulses in response to said second gating signal, said bit streams being entered into the register such that the binary output of the register after shifting one of said bit streams in its associated direction in response to any number of clock pulses in the presence of its associated gating signal is the same as the binary output which would have been obtained by shifting the other bit stream in the opposite of its associated direction in response to the same number of clock pulses.

8. The method of claim 7 wherein said logic bit streams are generated by exclusively OR'ing together the bits of the register binary output, the arrangement being dependent on the number of register stages.

9. The method of claim 8 wherein one of the outputs to be exclusively OR'ed is derived from the last flip-flop stage before the information is shifted out of the register.

* * * * *